United States Patent [19]
Kiuchi

[11] Patent Number: 5,488,712
[45] Date of Patent: Jan. 30, 1996

[54] MEMORY CIRCUIT WITH PIPELINE PROCESSING

[75] Inventor: Toyoo Kiuchi, Tokyo, Japan

[73] Assignee: NEC Corporation, Tokyo, Japan

[21] Appl. No.: 816,396

[22] Filed: Dec. 27, 1991

[30] Foreign Application Priority Data

Dec. 28, 1990 [JP] Japan ................ 2-417522

[51] Int. Cl.$^6$ ............... G06F 13/16; G06F 5/06; G11C 7/00
[52] U.S. Cl. ............ 395/431; 395/436; 364/DIG. 1; 364/249.2; 364/259.2; 364/259.5
[58] Field of Search ................ 395/425; 365/240, 365/221

[56] References Cited

U.S. PATENT DOCUMENTS

| | | | |
|---|---|---|---|
| 4,538,226 | 8/1985 | Hori | 395/250 |
| 4,827,405 | 5/1989 | Kiuchi | 395/375 |
| 5,058,076 | 10/1991 | Kiuchi | 365/230.01 |
| 5,093,809 | 3/1992 | Schmitt-Landsiedel et al. | 365/230.03 |
| 5,379,379 | 1/1995 | Becker et al. | 395/250 |

FOREIGN PATENT DOCUMENTS

| | | |
|---|---|---|
| 0355560 | 8/1989 | European Pat. Off. . |
| 0393436 | 4/1990 | European Pat. Off. . |

*Primary Examiner*—Eddie P. Chan
*Assistant Examiner*—Reginald Bragdon
*Attorney, Agent, or Firm*—Whitham, Curtis, Whitham & McGinn

[57] ABSTRACT

A first-in, first-out (FIFO) type buffer circuit is positioned to hold write-data between a random access memory and a system data bus. A shift circuit is positioned between an address calculation circuit and a pointer circuit. The system data bus is connected to an output of the FIFO buffer circuit or a read-data circuit of the random access memory dependent on an operation mode between writing and reading modes, and the pointer circuit is connected to the address calculation circuit or the shift circuit dependent on the operation mode. Accordingly, pipeline control is realized, even if the data transfer and the memory processing are reversed in order between the writing and reading modes.

3 Claims, 6 Drawing Sheets

MEMORY CIRCUIT WITH PIPELINE PROCESSING

BACKGROUND OF THE INVENTION

1. Field of the Invention

The present invention generally relates to a memory circuit and, more particularly, to a memory circuit adapted to high speed memory access in which the pipeline processing is realized.

2. Description of the Prior Art

Logic devices are required to operate with high speed. For this purpose, pipeline processing has been widely adopted in logic circuits. In a conventional memory circuit in which a RAM (random access memory) is directly connected to a data bus for a logic device in a pipeline control system, transfer of data to be written on the data bus and writing of the transferred data into the memory are carried out in one stage. In the same manner, reading of data from the memory and transfer of the read data on the data bus are also carried out in one stage. That is, the transfer of the data is carried out without dividing the writing of the data into the memory and the reading of the data from the memory, respectively, into different stages of the pipeline control. This is because the writing processing and the reading processing are opposite to each other in order, so that the continuity of the pipe line processing is not maintained, if the transfer of the data is separated from the data writing into the memory and the data reading from the memory.

In this conventional memory circuit, there is a disadvantage in that an average access time is not shortened to be less than the sum of a data transfer time and a memory processing (writing or reading) time at each stage of the pipeline control, because the data transfer and the memory processing are carried out in one stage. The detail of the disadvantage will be explained in the later description to be made by referring to the drawings.

SUMMARY OF THE INVENTION

Accordingly, it is an object of the invention to provide a memory circuit which is accessed with high speed.

It is a further object of the invention to provide a memory circuit for which processing time of a pipeline stage is shortened.

According to the invention, a memory circuit is provided which comprises a first-in, first-out (FIFO) type buffer circuit provided between a random access memory (RAM) and a system data bus. The FIFO type buffer circuit holds data successively supplied from the system data bus at a data writing mode. An address calculation circuit calculates an address in accordance with data on an address bus. An address pointer designates an address of the memory. A first selection circuit selects one of a read data bus connected to said memory and a data bus connected to the FIFO type buffer circuit in response to first and second selection signals. A shift circuit holds an address, the shift circuit being connected to the address calculation circuit. A second selection circuit selects one of an address bus connected to the address calculation circuit and an address bus connected to the shift circuit in response to a read/write (R/W) control signal. A mode designating signal is generated and supplied to the memory based on a first control signal supplied to the FIFO type buffer circuit, the first selection signal supplied to said first selection circuit and a second control signal supplied to the shift circuit, respectively, in response to the read/write (R/W) control signal. A comparison circuit compares the address of the shift circuit and the address of the address pointer to generate the second selection signal supplied to the first selection circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Before describing the memory circuit of the first preferred embodiment according to the invention, a conventional memory circuit will be explained.

Figure 1:
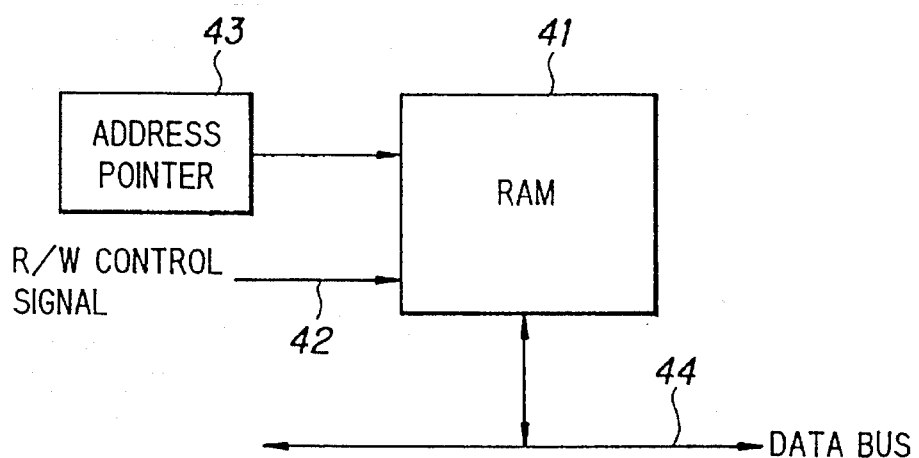
FIG. 1 is block diagram showing a conventional memory circuit.

FIG. 1 shows the conventional memory circuit which is used for the pipeline control, in which the data transfer and the memory processing (writing of data into a memory and reading of data from the memory) are carried out in the same stage. The conventional memory circuit comprises a RAM 41 connected with a R/W control signal line 42, an address pointer 43 for designating an address of the RAM 42, and a data bus 44 connected to the RAM 41.

Figure 2:
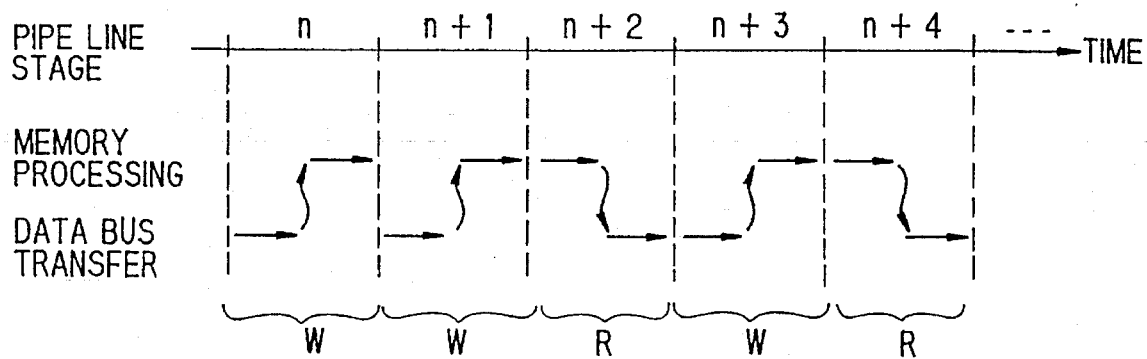
FIG. 2 is a timing chart showing the operation in the conventional memory circuit.

In the conventional memory circuit, data transferred on the data bus 44 are written into addresses of the RAM 41 designated by the address pointer 43 in accordance with a write control signal supplied from the R/W control signal line 42 at pipeline control stages "n", "n+1" and "n+3", as shown in FIG. 2.

On the other hand, data stored in the RAM 41 are read from addresses of the RAM 41 designated by the address pointer 43 to be transferred on the data bus 44 in accordance with a read control signal 25 supplied from the R/W control signal line 42 at the pipeline control stages "n+2" and "n+4", as also shown in FIG. 2.

As is apparent from FIG. 2, the data transfer and the memory processing (write into the RAM 41 or read from the RAM 41) are carried out in the same stage.

Figure 3:
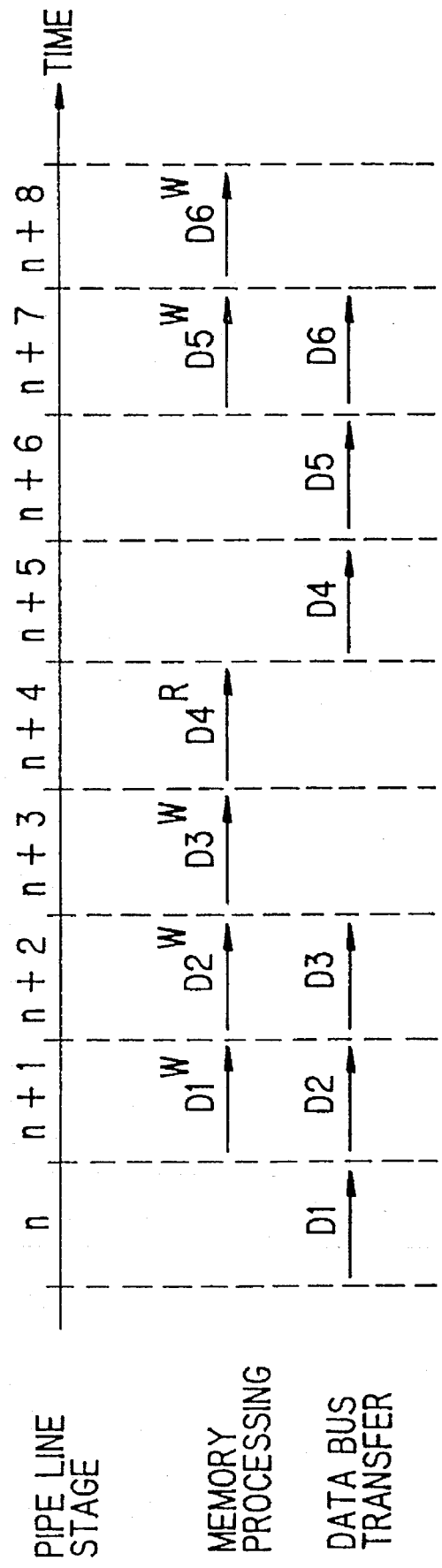
FIG. 3 is another timing chart showing the operation in the conventional memory circuit.

On the other hand, FIG. 3 shows the operation of the conventional memory circuit, in which the data transfer and the memory processing are carried out in different stages of the pipeline control. As shown therein, the reading of data D4 from the RAM 41 is carried out between the writing of data D1, D2 and D3 and the writing of data D5 and D6, so that writing of the data D3 and reading of the data D4 are carried out without data transfer at the pipeline stages "n+3"

and "n+4", and transfer of the data D4 and D5 is carried out without memory processing at the pipe line stages "n+5" and "n+6".

As understood from this operation, in which the data transfer and the memory processing are carried out in different stages, an average access time of the RAM 41 is shortened if one of the writing and reading processings is consecutively carried out. For instance, if the data transfer and the memory processing (writing or reading) take the same time T, the average access time S is calculated by the below equation:

$$S=[(N+1)/N]\cdot T,$$

where N is a number representing how many times writing or reading of data is consecutively carried out. If the number N is indefinitely large, the average time S becomes nearly equal to the time T.

On the contrary, when the writing and reading processings are carried out alternately, stages for carrying out only one of the writing and reading processings occur very often, so that the average access time S is not shortened, in spite of the adoption of the pipeline control. For this reason, the data transfer and the memory processing are carried out in the conventional memory circuit in one stage, in spite of the fact that there is a case where the average access time is shortened to a great extent by separating the data transfer and the memory processing into adjacent stages.

As described before, the time necessary for each stage is the sum of the data transfer and the memory processing in the conventional memory circuit. Therefore, the average access time is not shortened to be less than a value of the before described sum. For instance, when the data transfer on the data bus 44 takes 30 nanoseconds (ns) and the memory processing (write into the RAM 41 or read from the RAM 41) takes 30 ns, each stage is not shortened to be less than 60 ns in the pipeline control operation. Therefore, even if a high speed operation is realized in logic devices other than the RAM 41 by the pipeline control, the conventional memory circuit hinders the high speed operation of a pipe line control system.

In fact, the high speed operation of the pipe line control system is not hindered by logic devices such as logic calculation circuits and the like, but rather is hindered by memory circuits and buses. Accordingly, a memory circuit which is accessed with high speed is required as realized in logic calculation circuits.

Figure 4:
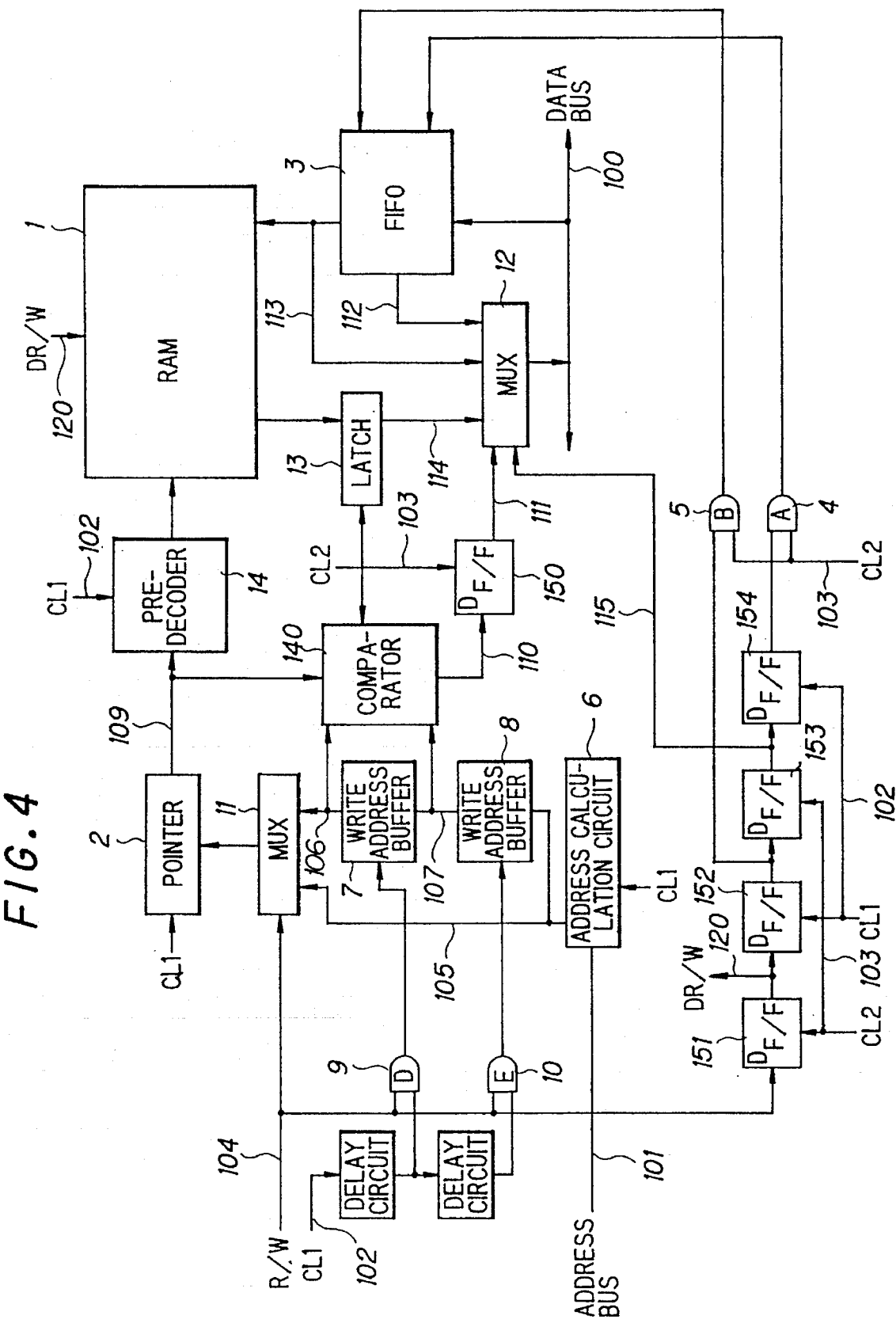
FIG. 4 is a block diagram showing a memory circuit of a first preferred embodiment according to the invention.

Next, a memory circuit of the first preferred embodiment according to the invention will be explained with reference to FIG. 4. In this memory circuit, a RAM 1 of 24 bits having memory cells of 1024 words is provided to be designated by address from a predecoder 14, in which an address signal of an address pointer 2 positioned on an address bus 109 is decoded to be supplied to the RAM 1, to which data is written and from which data is read, respectively, in 40 ns.

A first-in, first-out (FIFO) type buffer 3, having a capacity of 24 bits and of a two-stage structure, latches data of 24 bits supplied from a data bus 100 at the front stage thereof in response to an output signal of an AND gate 4 (FIFO input clock). When the back stage of the FIFO buffer 3 becomes empty (no effective data held), the 24 bit data latched in the front stage of the FIFO buffer 3 is shifted to the back stage thereof. Data output of the FIFO buffer 3 is carried out in response to an output signal of an AND gate 5 (FIFO output clock), so that data latched at the back stage of the FIFO buffer 3 is transferred to the RAM 1, and the back stage of the FIFO buffer 3 becomes empty in accordance with the invalidation by a rising edge of the output signal of the AND gate 5.

Signal lines 102 and 103 are provided to supply clock signals CL1 and CL2 having cycles of 40 ns to the predecoder 14 and other circuits, wherein the memory processing is carried out in the RAM 1 in synchronization with the clock signal CL2, and a latch 13 latches data read from the RAM 1 during a period of a rising edge of the clock signal CL2 to a following rising edge thereof.

A R/W control signal line 104 is provided to supply a R/W control signal to a multiplexer 11, so that an address signal 105 of 10 bits supplied from an address calculation circuit 6 is selected for data writing or data reading. That is, a "low" R/W control signal 104 controls data reading, while a "high" R/W control signal 104 controls data writing.

Write-address buffers 7 and 8 are provided to latch address signals of 10 bits on address buses 107 and 105 by rising edges of output signals supplied from AND gates 9 and 10. The write-address buffers 7 and 8 and the pointer 2 function as shift registers of 10 bits at the time of data writing (the R/W control signal being "high").

A multiplexer 11 is provided to transfer an address signal on the address bus 105 to the pointer 2 at the time of the data reading (the R/W control signal being "low"), and transfer an address signal on the address bus 106 to the pointer 2 at the time of data writing.

A comparator 140 is provided to supply a coincidence signal 110 to a D-type flip-flop 150 as a result of the comparison between one of address signals 106 and 107 latched in the write-address buffers 7 and 8 and an address signal 109 of the pointer 2, and the comparison is carried out by a rising edge of the clock signal CL2. The coincidence signal 110 has a binary code (1, 0), when the address signals 106 and 109 coincide with each other, and the coincidence signal 110 has the code (1, 1), when the address signals 107 and 109 coincide with each other, while the coincidence signal 110 has the code (0, x), when none of the address signals 106 and 107 coincide with the address signal 109, where the bit "x" may be any value of "1" and "0".

The coincidence signal 110 is delayed in the D type flip flop 150 by one clock, and is transferred to a multiplexer 12, to which the R/W control signal 104 is supplied through D-type flip-flops 151 to 153 to be delayed as a delayed signal 115 by 1.5 clocks. When the delayed signal 115 is "0" to instruct the data reading, and the coincidence signal 111 is of the binary code of (1, x) to indicate that the both address signals 106 and 107 do not coincide with the address signal 109, the multiplexer 12 selects a data bus 114 connected to the latch 13. On the other hand, when the delayed signal 115 is "0", and the coincidence signal 111 is the code (1, 0), the multiplexer 12 selects a data bus 113, and when the delayed signal 115 is "0", and the coincidence signal 111 is the code (1, 1), the multiplexer 12 selects a data bus 112. The data bus 112 is for data of the front stage of the FIFO 3, and the data bus 113 is for the data of the back stage of the FIFO 3. On the contrary, when the delayed signal 115 is "high" to control data writing, the multiplexer is at a high impedance state.

The D-type flip-flop 151 is supplied with the R/W control signal 104 to generate a mode designating signal which is "0" to shift the RAM 1 to the reading mode, and "1" to shift the RAM 1 to the writing mode.

The address calculation circuit 6 calculates an address in accordance with address data on an address bus 101, so that an address signal thus calculated is supplied on the address bus 105 to indicate a write-address or a read-address.

Operation of the memory circuit will be explained with reference to FIGS. 5 and 6.

At the times of A, B and C, addresses a, b and c are calculated in the address calculation circuit 6 by receiving data on the address bus 101 and the addresses a, b and c are supplied on the address bus 105 as read-addresses, because the R/W control signal 104 is low. Consequently, the multiplexer 11 selects the address bus 105 in response to the R/W control signal 104 of "0", so that the read-addresses a, b and c are supplied through the multiplexer 11 to the pointer 2. The read-address a, b and c are supplied from the pointer 2 through the address bus 109 to the predecoder 102, so that address signals thus decoded are delayed to be supplied to the RAM 1 by 0.5 clock.

The R/W control signal 104 is latched in the D-type flip-flop 151 in synchronization with the clock signal CL2, so that the mode designating signal 120 goes "low". As a result, the RAM 1 is assumed to be under the reading mode, so that data a, b and c are read from the addresses a, b and c at the times of A', B' and C'. Thus, the read data a, b and c are latched in the latch 13 by rising edges of the clock signal CL2, and transferred to the multiplexer 12. The delayed signal 115 goes "low" in accordance with the R/W control signal 104 going "low", so that the multiplexer 12 selects the data bus 114 to transfer the data a, b and c from the latch 13 to the data bus 100.

As described above, it takes 1.5 clocks at the data reading mode to generate the addresses a, b and c of the RAM 1 in the address calculation circuit 6, and read the data a, b and c from the generated addresses a, b and c of the RAM 1.

Next, it is assumed that the writing mode is designated at the time of D, when the R/W control signal 104 goes "high". In this first preferred embodiment, it is also assumed that address data of "3FF$_H$" (hexadecimal code) is stored in the write-address buffers 7 and 8 at the initial state prior to operation, and that the address "3FF$_H$" of the RAM 1 is an exclusively occupied area which is not used for effective data.

At the times of D, E and F, addresses d, e and f are generated in the address calculation circuit 6 to be supplied on the address bus 105, and the multiplexer 11 selects the address bus 106 in response to the R/W control signal going "high". Thus, the pointer 2, and the write-address buffers 7 and 8 function as shift registers. That is, the pointer 2 latches data of the write-address buffer 7 at the time D, the write-address buffer 7 latches data of the write-address buffer 8 at a time which is behind the time D by a short time, and the write-address buffer 8 latches the address d. In the similar manner, data shift is repeated in the pointer 2, and the write address buffers 7 and 8 at the times of E and F. Subsequently, the address d is held in the pointer 2 at the time F.

The R/W control signal 104 makes the mode designating signal 120 high, so that the RAM 1 is controlled to be in the data writing mode. Consequently, the data d on the data bus 100 is written into the address d of the RAM 1 during the times of F' to G'.

In more detail, the data d is transferred on the data bus 100 after 1.5 clocks from the time when the address calculation circuit 6 generates the address d, and is latched at the front stage of the FIFO buffer 3 at the time F'. At this state, the back stage of the FIFO buffer 3 is empty, so that the data d is instantly transferred to the back stage thereof to be supplied on the data bus 113. At this moment, the RAM 1 is under the data writing mode, so that the data d is written into the address d of the RAM 1 before the time G'.

At the time G', the data d held at the back stage of the FIFO buffer 3 is invalidated to make it at a vacant state. Therefore, the next data e is supplied from the data bus 100 to be latched at the front stage of the FIFO buffer 3 at this time, and is instantly latched at the back stage thereof. Consequently, the data e is supplied on the data bus 113 at a time which is behind the time G' by a short time.

On the contrary, the R/W control signal is turned back to be low at the time C, so that the RAM 1 is again under the data reading mode. As a result, the data e is supplied to the data bus 100 at a time behind the time G' by a short time.

On the other hand, the addresses e and f which are generated in the address calculation circuit 6 at the times of E and F are held in the write-address buffers 7 and 8, and the pointer 2 holds a following read-address g at this time.

The write-data f is supplied on the data bus 100 during a time of G' to H', and is latched at the front stage of the FIFO buffer 3 at the time H'. The data e has been already latched at the back stage of the FIFO buffer 3, so that the data f is kept to be latched at the front stage thereof.

The RAM 1 is turned to be under the data reading mode, so that the data g and h read from the addresses g and h which are supplied from the address calculation circuit 6 to the pointer 2 are supplied on the data bus 100 with the delayed time of 1.5 clocks.

Accordingly, during this period, write-addresses are held in the write-address buffers 7 and 8, and write data are held at the front and back stages of the FIFO buffer 3.

When the R/W control signal 104 again goes "low" at the time G, the addresses held in the write-address buffers 7 and 8 are supplied to the pointer 2, so that the write-data held in the FIFO buffer 3 are supplied to be written in the RAM 1. The writing mode starts at time G. However, the writing of the data stored in the FIFO 3 into the RAM 1 is delayed by a time as shown in FIG. 5, in which the address f is supplied from the buffer 8 to the pointer 2.

In the memory circuit of this first preferred embodiment, the consecutive timing relation is obtained between the address calculation and the data transfer, even if the data transfer and the memory processing are separated, as described above. As a result, the data writing mode and the data reading mode which are alternately controlled are carried out without the time-loss to realize the high speed operation in a pipeline control system.

Figure 5:
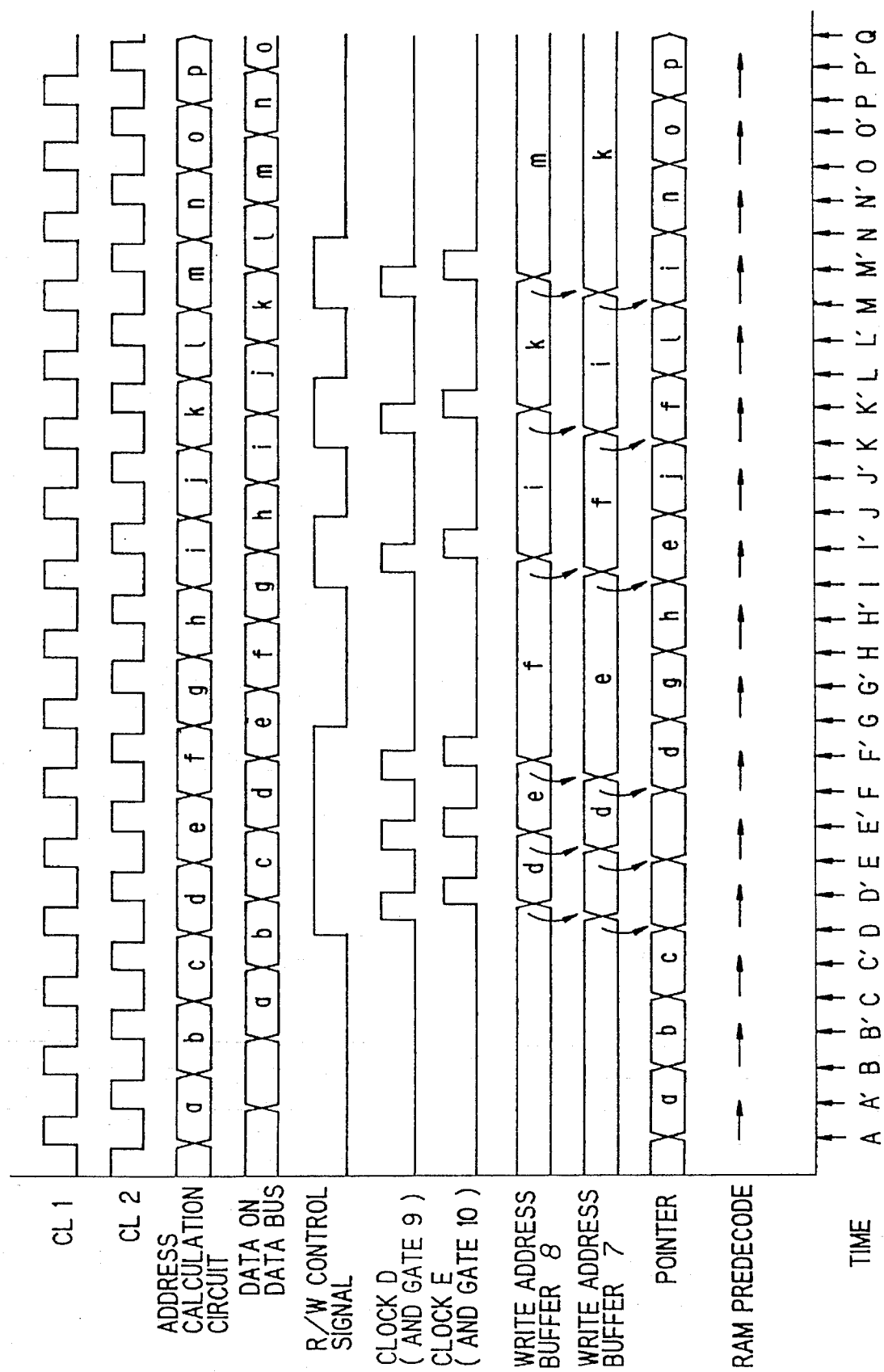
FIG. 5 is a timing chart showing the operation in the memory circuit of the first preferred embodiment according to the invention.
Figure 6:
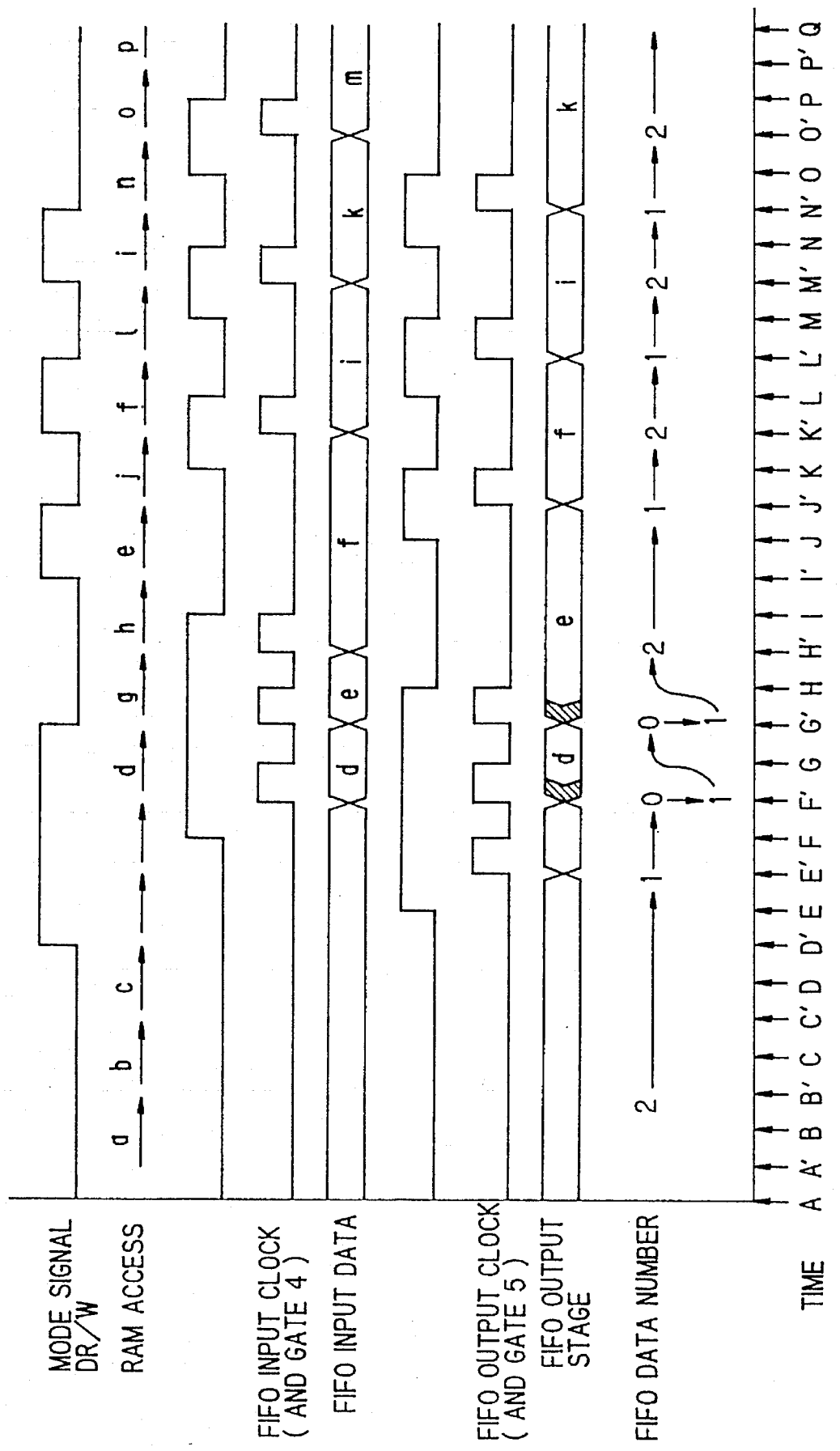
FIG. 6 is another timing chart showing the operation in the memory circuit of the first preferred embodiment according to the invention.

In FIGS. 5 and 6, the writing mode and the reading mode are alternately carried out at times following the time H, wherein no change is necessary in timings of the address calculation and the data transfer.

As described above, data to be stored is once held in the FIFO buffer 3, and thereafter written into the RAM 1 in the memory circuit of the first preferred embodiment according to the invention. Ordinarily, data is written into the RAM 1 in accordance with a trigger signal which is an address signal for data to be written into the RAM 1 at a writing stage coming after the next writing stage. At this moment, there is a case where data held in the FIFO buffer 3 is necessary to be once loaded on the data bus 100 prior to the writing thereof into the RAM 1. This case occurs when a calculated read address coincides with read-addresses in the writes address buffers 7 and 8. In this case, data to be written is reloaded on the data bus 100 in accordance with a comparison result of the comparator 140 before writing the data into the RAM 1. For this data processing, the data of the FIFO buffer 3 is not invalidated to be written into the RAM 1.

In this preferred embodiment, read-data or write-data for a calculated address is delayed to be transferred onto or from the data bus 100 by 1.5 clocks after the generation of the address. In addition, the timing does not depend on which mode is carried out between the writing and reading modes, and on the order of the two modes.

Furthermore, an access to data of the RAM 1 is possible to be carried out by each 40 ns in this preferred embodiment. This can be realized because the writing of data into the RAM 1 and the transfer of data to be written into the RAM 1 on the data bus 100 are separated and interposed. Such a separation of the transfer processing and the memory processing enhances the effectiveness of the pipeline control, and the average access time becomes half as compared to that in the conventional memory circuit.

A memory capacity of the RAM 1, a bit width of the buffers, the pointer, the buses, etc., a frequency of the clock signals, etc., may be different from those of the preferred embodiment.

Figure 7:
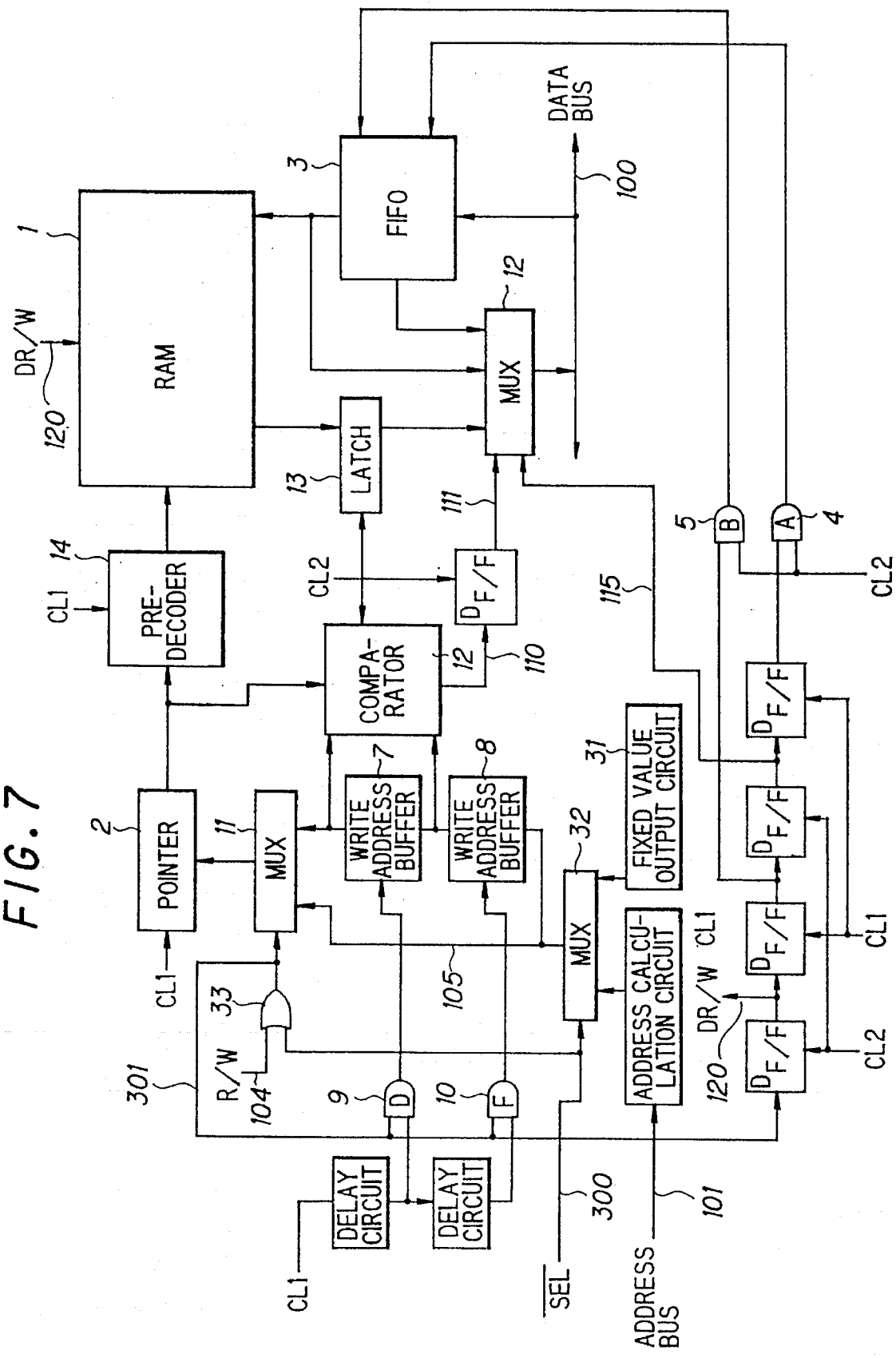
FIG. 7 is a block diagram showing a memory circuit of a second preferred embodiment according to the invention.

FIG. 7 shows a memory circuit of a second preferred embodiment according to the invention, wherein like parts are indicated by like reference numerals, and a fixed value output circuit 31 and a multiplexer 32 are additionally provided.

The fixed value output circuit 31 supplies a fixed value "$3FF_H$" of 10 bits to the multiplexer 32, by which an output of the address calculation circuit 6 is selected, when a memory selection signal (SEL) 300 is "0", and an output of the fixed value output circuit 31 is selected, when the memory selection signal 300 is "1". As different from the first preferred embodiment, a R/W control signal 104 is supplied to an OR gate 33, to which the memory selection signal 300 is also supplied.

In this second preferred embodiment, when the memory circuit is not selected in the presence of the memory selection signal 300 of "1", the memory circuit operates in the same manner as the writing mode, so that data is written into a fixed value address of "$3FF_H$" of the RAM 1, and no access is carried out to the RAM 1 other than the fixed value address.

In the first Preferred embodiment, a data source (not shown) supplies all data to be written on the data bus 100 and dummy writing processing must be carried out by twice. This is because the data are written into the RAM 1 without being left in the FIFO buffer 3.

In the second preferred embodiment, however, there is an additional advantage in that data in the FIFO buffer 3 is automatically written into the RAM 1, when the memory circuit is not selected.

As described above, the memory circuit comprises the shift registers and the FIFO buffer to absorb the alteration of the conduct order of the data transfer and the memory processing dependent on the difference between the writing and reading modes, so that the effectiveness of the pipeline control is enhanced. Accordingly, the processing time is largely reduced at each pipeline stage to shorten the average access time to the RAM. For instance, if a time necessary for the data transfer and a time necessary for the memory processing are assumed to be equal, a processing time becomes half at each stage of the pipeline control.

In the invention, the difference between the writing and reading modes is automatically absorbed in a hardware, so that there is an advantage in that an address is designated and data is supplied to a system data bus, respectively, at a constant timing without depending on the difference between the writing and reading modes. Therefore, the writing and reading modes are arranged in an arbitrary order, and the memory processing can be carried out, as if only the reading mode is carried out, because the writing mode is carried out as done in the reading mode by the pipe line processing. This means that a memory access speed is increased without increasing a memory administration load by twice, as compared to those in the conventional memory circuit, because an output of the address calculation circuit, the data transfer on the system data bus, and the change of the R/W control signal may be only controlled at each stage of the pipe line control, as shown in FIGS. 5 and 6.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A memory circuit, comprising:

a first-in, first-out (FIFO) type buffer circuit provided between a random access memory and a system data bus, said FIFO type buffer circuit holding data successively supplied from said system data bus in a data writing mode;

an address calculation circuit for calculating an address in accordance with data on an address bus;

an address pointer holding an address for designating an address of said random access memory;

a first selection circuit for selecting one of a read data bus connected to said random access memory and a data bus connected to said FIFO type buffer circuit in response to first and second selection signals;

a shift circuit for holding an address, said shift circuit being connected to said address calculation circuit;

a second selection circuit, connected to said address pointer, for selecting one of an address bus connected to said address calculation circuit and an address bus connected to said shift circuit in response to a read/write control signal;

a circuit for generating a mode designating signal supplied to said random access memory, a first control signal supplied to said FIFO type buffer circuit, said first selection signal supplied to said first selection circuit, and a second control signal supplied to said shift circuit, respectively, in response to said read/write control signal; and a comparison circuit for comparing said address of said shift circuit and said address of said address pointer to generate said second selection signal supplied to said first selection circuit, wherein said circuit for generating generates said mode designating signal and said first selection signal by delaying said read/write control signal, said first control signal by logic calculation of a delayed signal which is obtained by delaying said read/write control signal, and said second control signal to be obtained by selectively masking a clock signal.

2. A memory circuit, according to claim 1, wherein said comparison circuit compares addresses supplied from said shift circuit and said address pointer to provide said second selection signal dependent on coincidence and non-coincidence therebetween.

3. A memory circuit, according to claim 2, wherein said first selection circuit selects said read data bus connected to said random access memory in accordance with said first and second selection signals, said first selection signal being a low level, and said second selection signal indicating non-coincidence, and said first selection circuit selects said data bus connected to said FIFO type buffer circuit in accordance with said first and second selection signals, said first selection signal being said low level, and said second selection signal indicating coincidence.

* * * * *